(12) United States Patent
Henskes

(10) Patent No.: US 9,458,997 B2
(45) Date of Patent: Oct. 4, 2016

(54) LAMP WITH PROTECTION AGAINST SHINING IN AN UNDESIRED DIRECTION

(71) Applicant: Steinar Holding B.V., Haarlem (NL)

(72) Inventor: Steinar Finn Boye Henskes, Haarlem (NL)

(73) Assignee: Steinar Holding B.V., Haarlem (NL)

( * ) Notice: Subject to any disclaimer, the term of this patent is extended or adjusted under 35 U.S.C. 154(b) by 0 days.

(21) Appl. No.: 14/409,945

(22) PCT Filed: Jun. 14, 2013

(86) PCT No.: PCT/NL2013/050426
§ 371 (c)(1),
(2) Date: Dec. 19, 2014

(87) PCT Pub. No.: WO2013/191540
PCT Pub. Date: Dec. 27, 2013

(65) Prior Publication Data
US 2015/0233563 A1    Aug. 20, 2015

(30) Foreign Application Priority Data

Jun. 22, 2012 (NL) .................................... 1039692
Jan. 23, 2013 (NL) .................................... 2010170

(51) Int. Cl.
| | |
|---|---|
| *F21V 23/04* | (2006.01) |
| *F21V 23/00* | (2015.01) |
| *F21S 9/02* | (2006.01) |
| *F21V 14/02* | (2006.01) |
| *F21Y 101/02* | (2006.01) |

(52) U.S. Cl.
CPC .............. *F21V 23/0492* (2013.01); *F21S 9/02* (2013.01); *F21V 14/02* (2013.01); *F21V 23/003* (2013.01); *F21Y 2101/02* (2013.01); *F21Y 2101/025* (2013.01)

(58) Field of Classification Search
USPC ........................................ 362/202, 208, 802
See application file for complete search history.

(56) References Cited

U.S. PATENT DOCUMENTS

| | | | |
|---|---|---|---|
| 1,658,188 A | 2/1928 | Embury | |
| 2,328,855 A | 9/1943 | Stephens | |
| 6,062,702 A | 5/2000 | Krietzman | |
| 2004/0184273 A1* | 9/2004 | Reynolds | ................ A47K 13/24 362/394 |
| 2005/0002186 A1* | 1/2005 | Krieger | .................. F21L 4/027 362/183 |

(Continued)

FOREIGN PATENT DOCUMENTS

| | | |
|---|---|---|
| GB | 533551 | 10/1939 |
| NL | 55525 | 11/1943 |
| WO | 2005/110220 | 11/2005 |

*Primary Examiner* — Laura Tso
(74) *Attorney, Agent, or Firm* — Thompson Hine LLP

(57) ABSTRACT

The invention relates to a lamp, comprising a light source for generating a light beam in the direction of a main axis and a first direction-dependent tilt switch for controlling the light source depending on the angle between the main axis and the vertical, wherein the switching direction of the first tilt switch extends in a main plane which runs along the main axis. This enables the use of a tilt switch which functions in only one direction and has a much simpler construction than a switch which functions in two dimensions, such as in the prior art. Furthermore, such a switch has the advantage of a small volume, which advantage is also realized when more switches are used in the lamp. According to another preferred embodiment, the lamp comprises a housing and the housing is provided with marking means for marking the position of the lamp in which the main plane extends vertically.

20 Claims, 2 Drawing Sheets

(56) References Cited

U.S. PATENT DOCUMENTS

Figure 1:
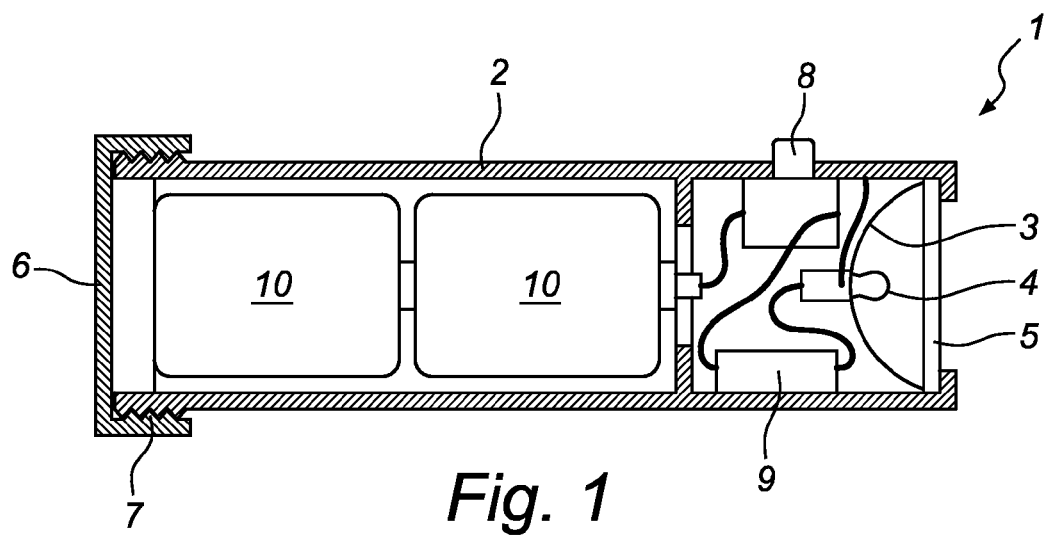

| | | | | |
|---|---|---|---|---|
| 2005/0128741 A1* | 6/2005 | Matthews | | F21L 4/027 362/206 |
| 2005/0259420 A1* | 11/2005 | Petersen | | B60Q 3/065 362/253 |
| 2008/0144309 A1* | 6/2008 | Nagata | | A47G 21/02 362/120 |
| 2010/0066550 A1* | 3/2010 | Mottram | | F21L 4/00 340/644 |
| 2010/0219775 A1 | 9/2010 | Maglica et al. | | |
| 2011/0163883 A1* | 7/2011 | Ho | | A01K 7/06 340/615 |
| 2012/0098465 A1* | 4/2012 | Rothschild | | H05B 37/02 315/360 |
| 2012/0176780 A1* | 7/2012 | Gross | | F21L 4/027 362/184 |

* cited by examiner

LAMP WITH PROTECTION AGAINST SHINING IN AN UNDESIRED DIRECTION

RELATED APPLICATIONS

This application is a National Phase of co-pending PCT/NL2013/050426 filed Jun. 14, 2013, which claims priority to NL 1039692 filed Jun. 22, 2012 and NL 2010170 filed Jan. 23, 2013, each of which is expressly incorporated by reference herein in its entirety.

The present invention relates to a lamp, comprising a light source for generating a light beam extending in the direction of a main axis and a first direction-dependent tilt switch for controlling the light source depending on the angle between the main axis and the vertical. Such a lamp is used, for example, to drive away birds. Most birds fly away when approached by a patch of light on the ground caused by a lamp. This method of driving away birds requires a light source having a high luminous flux. If the lamp and its light source are directed upward and the light beam shines upward, there is a risk that the light beam will disrupt air traffic. It will be clear that this problem arises in particular, but not exclusively, when driving away birds from airports. There is also the risk that the light beam is directed into the eyes of people, for example road users, which is unpleasant and potentially dangerous. The direction-dependent tilt switch prevents the light beam from shining upward in a direction with a vertical component. It is of course possible to set the angle at which the light source is switched off to have a different value.

Such a lamp is known from NL-C-55525. The lamp known from this document comprises a single tilt switch which switches off the light source when the axis of the light beam emerging from the light source deviates by a predetermined degree from the vertical. This prevents the light source from shining when it deviates from the vertical by more than the predetermined degree. In this known lamp, use is made of a ball switch having a complicated and costly construction.

The object of the present invention is to provide such a lamp in which switches of a simpler construction may be used.

This object is achieved by a switch of this type, wherein the switching direction of the first tilt switch extends in a main plane which runs along the main axis. This measure provides the possibility of using a tilt switch which functions in only one direction and which has a much simpler construction than a switch which functions in two dimensions, such as in the prior art. Furthermore, such a switch has the advantage of a small volume, so that such a switch is much smaller than a tilt switch which functions in more directions. Even when more than one switch is used in the lamp, according to the following embodiments, there is still the advantage of a smaller volume.

However, such a switch is only functional in one direction. In order to have the greatest possible effect, the switching direction of the first tilt switch preferably extends substantially in the direction of the main axis.

The abovementioned measure is predominantly effective when the lamp is in a position in which the switching direction of the tilt switch coincides with a vertical plane. In order to keep the lamp in this position, the lamp preferably comprises a housing and the housing is preferably provided with marking means for marking the position of the lamp in which the main plane extends vertically. However, in this case the user does have to move the lamp into a position in which the marking means indicate that the lamp is in the position in which the switching plane of the tilt switch extends vertically.

According to an alternative embodiment, at least the light source and the first tilt switch are arranged in a frame which is rotatable about its main axis with respect to the housing of the lamp, the centre of gravity of which frame is located below the main axis. By means of this measure, the part of the lamp which is relevant to the correct operation of the restriction on the direction of emergence of the light beam, namely the combination of light source and the tilt switch, always assumes the vertical position.

However, it is also possible to provide the lamp with a second direction-dependent tilt switch connected in series with the first tilt switch, which second tilt switch is designed to control the light source depending on the rotation position of the lamp about its axis. By this means, the light source may only be switched on in the position in which both directional switches indicate that the lamp has assumed the correct position.

The second tilt switch preferably has two switching directions which are both situated in a transverse plane extending at right angles to the main axis and the second tilt switch is designed to switch on the light source only when the vertical extends between both switching directions. Said second tilt switch is configured as a single switch having two different switching directions, which do however lie in the same plane, so that the construction is simple.

However, it is also possible that the lamp is provided with a third direction-dependent tilt switch connected in series with the first and the second tilt switch, that the second tilt switch is arranged with its switching direction in a transverse plane extending at right angles to the main axis and enclosing a first angle with the main plane, that the third tilt switch is arranged with its switching direction in a transverse plane extending at right angles to the main axis and enclosing a second angle with the main plane, which second angle is opposite to the first angle and that the second and third tilt switches are designed to switch on the light source only when the vertical extends between both switching directions. In this case, a total of three tilt switches are used, but they are all uncomplicated and therefore have a simple construction and are moreover inexpensive.

According to a simple preferred embodiment, the lamp is provided with a hand-operated manual switch and the tilt switches are connected in series with the manual switch and with the light source and the energy source. This embodiment does not necessitate any further electrical components, but upon reaching an upwardly directed position, the light source will simply be switched off.

However, it is also possible to provide the lamp with a dimmer which is connected between the energy source and the light source, wherein the tilt switches are designed to control the dimmer. This makes it possible to reduce the light intensity of the light source upon reaching an upwardly directed position.

The tilt switches described above may be mechanical switches, but also electronic switches connected to an electric circuit which itself may comprise a microprocessor. The circuit may perform an angle-dependent function on the light to be emitted, for example a light intensity as a function of the angle, in which case a dimmer effect occurs, but it is possible to control a frequency, intensity, duty cycle or even degree of divergence or light color, depending on the light source used. It is also possible to realize time-dependent effects in this manner, such as dimming or illuminating after a certain period at a certain angle. It is also possible, for example, to emit a regular light beam at certain angles, whilst switching over to laser light at other angles.

Inclinometers or accelerometers are suitable for electronically measuring the angle. In the present invention it is possible, in particular, to make use of the Digital Output Accelerometer XL 362 supplied by Analog Devices.

According to an embodiment of the present invention, it is possible to adjust the angle at which the laser activates or deactivates (the critical angle) by means of a switch having positions. In this case, for example, it is possible to use five specific positions, such as: −20°, −10°, 0°, 10°, 20° with respect to the horizon or with respect to another predetermined orientation of a longitudinal axis of the lamp.

This option may be used both on a fixed device, i.e. a device arranged in a cupboard or on a stand, and on a portable/mobile device.

Although an external energy source, such as a separate accumulator or battery unit, is not ruled out, it is preferable that the energy source is accommodated in the lamp in the form of a battery.

An important area of application of the invention is driving away birds with the aid of light, for example at airports. It has been found that birds can be more effectively driven away by laser light. It is therefore preferable for the light source to be designed to generate laser light.

In order to be able to retrospectively provide an existing lamp with the functions according to the invention, it is beneficial if the tilt switches are accommodated in a part which is separable from the rest of the lamp, such as a lid for a battery compartment.

In order to prevent the light source being switched off in the event of an undesired sudden movement, the lamp is preferably provided with a delay circuit for delaying the switching off of the light source when there is a change in the tilt of the lamp.

In general, the user will hold the lamp in his hand. However, it is also possible for the lamp to be mounted in or on a fixedly arranged structure, such as a stand, a switch cupboard or a pole. Such an embodiment is beneficial when birds always cause a nuisance in the same location, such as in the vicinity of airport runways.

There is also the potential risk of the structure blowing over or falling over, so that the measures according to the invention are also useful in such situations.

Figure 2:
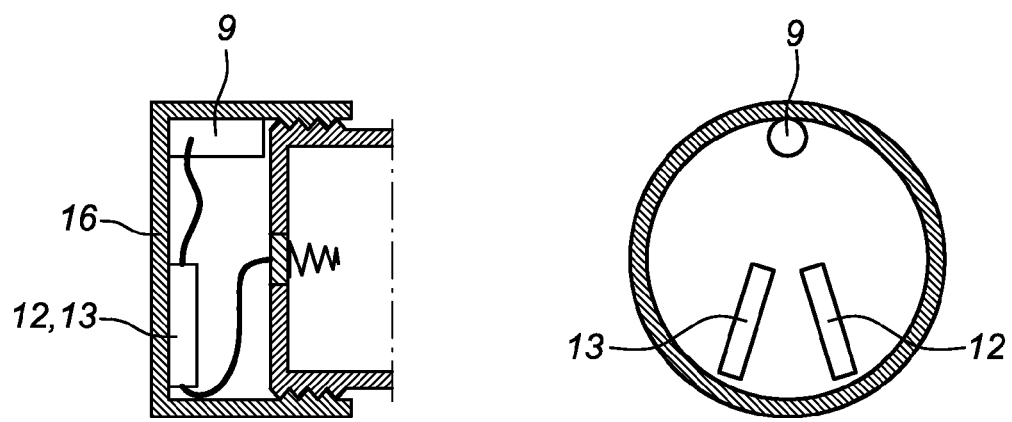
Figure 3:
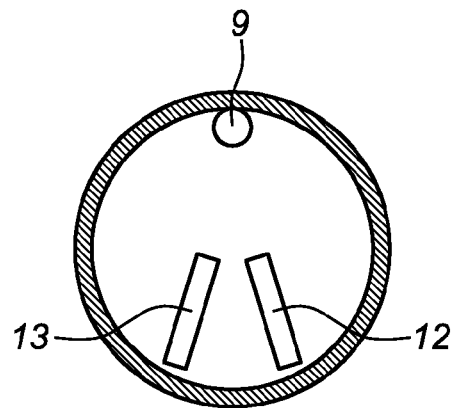
Figure 4:
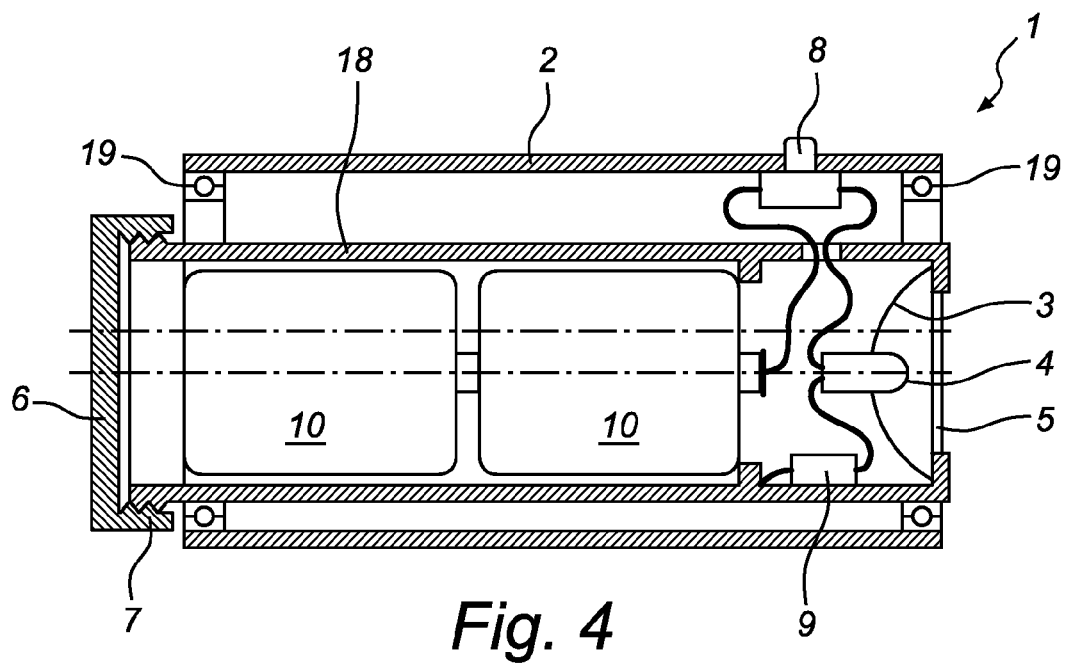
Figure 5:
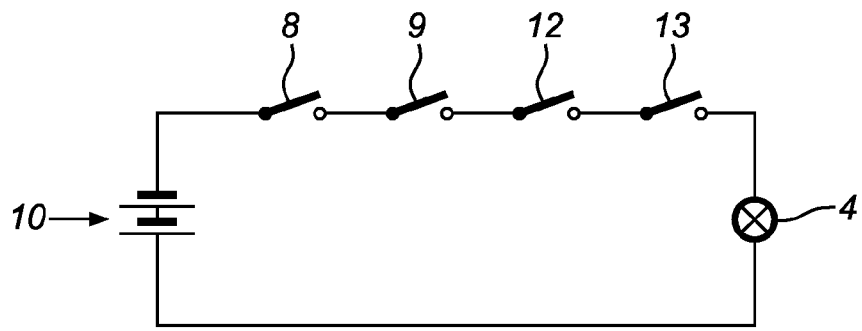
Figure 6:
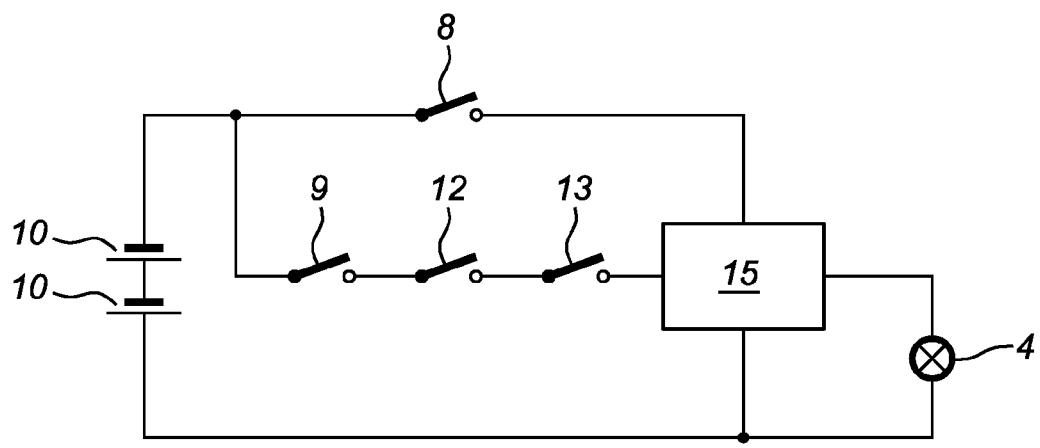

The invention will be explained below with reference to the attached drawings, in which:

FIG. 1: shows a longitudinal sectional view of a first embodiment;

FIG. 2: shows a longitudinal sectional view of a battery lid according to a second embodiment;

FIG. 3: shows a cross sectional view of the lid illustrated in FIG. 2;

FIG. 4: shows a longitudinal sectional view of a third embodiment;

FIG. 5: shows an electrical circuit diagram of a lamp according to the invention; and FIG. 6: shows an alternative circuit diagram of a lamp according to the invention.

A lamp according to the invention, denoted overall by reference numeral 1, comprises a substantially cylindrical housing 2 which is provided with a reflector 3 at the front end side, in the focal point of which a light source 4 is arranged, for example in the form of an LED or a laser LED. Other types of light source are not ruled out. A transparent wall 5 is arranged on the outer edge of the reflector 3 for protection. A lid 6 is arranged on the rear end side of the housing, which lid is connected to the housing 2 by means of a screw thread 7 and can be removed from the housing. A hand-operated manual switch 8 is arranged in the housing 2 and adjoining the housing 2.

A direction-sensitive tilt switch 9 is arranged in the housing 2, which tilt switch is arranged with its longitudinal direction parallel to the axis of the cylindrical housing 2. In this case, it is assumed that the switching direction of the tilt switch corresponds to the horizontal position of its longitudinal direction. This assumption makes it easier to understand the invention, but it is also possible for tilt switches of a different type or with their switching direction deviating from the longitudinal direction to be used. The switching direction of the switch is understood to mean the direction in which the switch closes during a tilting movement in the first direction and opens during the opposite movement.

Furthermore, wiring is provided in order to connect the electrical components to one another. In the figure, there are also two batteries 10 present. The electrical circuit diagram is limited to a series circuit of the batteries 10, the manual switch 8, the tilt switch 9 and the light source 4.

The use of the lamp 1 will be explained below. When the lamp is held with its axis in the illustrated horizontal position or with a light beam directed downward, the light source 4 will be supplied with electrical energy when the manual switch 8 is switched on and the light source 4 will light up, so that a light beam is generated. This light beam may then be used, for example, to generate a patch of light on the ground which causes birds to be driven away. However, when the lamp 1 is directed obliquely upward, the tilt switch 9 will respond and switch off the light source 4, so that the light beam is prevented from shining with an upwardly directed component. It should be noted here that it is only possible to ensure the correct operation of the tilt switch 9 when the lamp 1 is in its correct rotation position with respect to its axis. As the manual switch 8 is located at the top in this correct position, the user can turn the lamp 1 until it is in the correct position. In this case, the switch 8 functions as a marker.

In the embodiment explained above, the user himself must hold the lamp 1 in the correct rotation position in order for the protection provided by the tilt switch 9 to function correctly. In the embodiment illustrated in FIGS. 2 and 3, the protection also functions when the lamp 1 is not held in the correct rotation position. To this end, said lamp 1 comprises a second tilt switch 12 and a third tilt switch 13 in addition to the first tilt switch 9. The first tilt switch 9 is arranged in the lamp in the same direction as in the embodiment illustrated in FIG. 1. The second and third tilt switches 12, 13 are arranged in a substantially vertical direction and enclose a small angle with the main plane. For clarification, it is also assumed in this case that tilt switches are used of the type where the switching direction coincides with the longitudinal direction of the switches. All of the tilt switches 9, 12, 13 and the manual switch 8 are connected in series with the battery 10 and the light source 4, as illustrated in FIG. 5.

The second and third tilt switches 12, 13 are both opened only when their longitudinal direction coincides with the vertical, i.e. when the lamp 1 is in the position in which the main plane of the lamp is in a substantially vertical position. It is only in this position that the position of the first tilt switch 9 determines whether the light source is switched on, so that the same functionality is realized in this position as in the first embodiment.

Furthermore, the embodiment illustrated in FIGS. 2 and 3 differs from the first embodiment in that the tilt switches 9, 12, 13 are arranged in the lid 16. This configuration offers the possibility of modifying an existing lamp according to the invention by replacing a 'normal' lid without switches with a lid 16 according to this embodiment.

In all of the embodiments explained above the switches 8, 9, 12, 13 are connected in series, as a result of which the light source 4 can simply be switched on only when the lamp 1 is in the correct position. However, it is also possible to use a dimmer 15 which causes the light source 4 to burn with limited power in positions in which the light source is extinguished in the preceding embodiments. A circuit diagram for the use of such a dimmer is illustrated in FIG. 6, in which the manual switch 8 can switch the dimmer 15 on and off and the series circuit of the tilt switches 9, 12, 13 can limit the power of the dimmer 15.

Finally, FIG. 4 illustrates an embodiment in which the light source 4, the batteries 10 and the tilt switch 9 always automatically assume the position in which the tilt switch is effective. For this purpose, these parts are accommodated in a frame 18 which is arranged in the housing 2 of the lamp 1 such that it can rotate about the longitudinal axis by means of bearings 19. By arranging the batteries 10, which form the heaviest part, eccentrically in the frame 18 with respect to the axis of rotation, gravity will cause the frame 18 to automatically move into the position in which the first tilt switch 9 can perform its function.

It will be clear that the measures in the embodiments explained above can be combined with one another and that the scope of protection of the resulting patent is determined solely by the claims.

The invention claimed is:

1. A lamp having an optical axis, comprising a light source for generating a light beam in the direction of the optical axis and a first direction-dependent tilt switch for controlling the light source depending on the angle between the optical axis and the direction of gravity, wherein the first tilt switch has a switching direction extending in a single main plane which runs along the optical axis and a number of distinct switching positions with each of the positions linked to a specific method of control of the light source, and wherein at least the light source and the first tilt switch are arranged in a frame which is rotatable about the optical axis with respect to a housing of the lamp, the center of gravity of the frame being located below the optical axis.

2. The lamp as claimed in claim 1, wherein the switching direction of the first tilt switch extends substantially in the direction of the optical axis.

3. A lamp having an optical axis, comprising a light source for generating a light beam in the direction of the optical axis and a first direction-dependent tilt switch for controlling the light source depending on the angle between the optical axis and the direction of gravity, wherein the first tilt switch has a switching direction extending in a single main plane which runs along the optical axis and a number of distinct switching positions with each of the positions linked to a specific method of control of the light source, and wherein the lamp is provided with a second direction-dependent tilt switch connected in series with the first tilt switch, which second tilt switch is designed to control the light source depending on the rotation position of the lamp about the optical axis.

4. The lamp as claimed in claim 3, wherein the second tilt switch has two switching directions which are both situated in a transverse plane extending at right angles to the optical axis and in that the second tilt switch is designed to switch on the light source only when the direction of gravity extends between both switching directions.

5. The lamp as claimed in claim 3, wherein the lamp is provided with a third direction-dependent tilt switch connected in series with the first and the second tilt switch, in that the second tilt switch is arranged with its switching direction in a transverse plane extending at right angles to the optical axis and enclosing a first angle with the main plane; and
in that the third tilt switch is arranged with its switching direction in a transverse plane extending at right angles to the optical axis and enclosing a second angle with the main plane, which second angle is opposite the first angle;
in that the second and third tilt switches are designed to switch on the light source only when the direction of gravity extends between both switching directions.

6. The lamp as claimed in claim 1, wherein the lamp is provided with a hand-operated manual switch and in that the first tilt switch is connected in series with the manual switch and with the light source and the energy source.

7. The lamp as claimed in claim 1, wherein the lamp is provided with a dimmer which is connected between the energy source and the light source and in that the first tilt switch is designed to control the dimmer.

8. The lamp as claimed in claim 1, wherein the energy source is accommodated in the lamp in the form of a battery.

9. The lamp as claimed in claim 1, wherein the light source is designed to generate laser light.

10. The lamp as claimed in claim 1, wherein the lamp comprises a separable part wherein the first tilt switch is accommodated.

11. The lamp as claimed in claim 1, wherein of the first tilt switch is a mechanical or electronic switch designed to control, as a function of the angle, a suitable effect depending on the used light source.

12. The lamp as claimed in claim 11, wherein a time-dependent effect is realized which occurs after a certain period at a certain angle.

13. The lamp as claimed in claim 11, wherein the lamp is mounted in or on a fixedly arranged structure.

14. The lamp as claimed in claim 3, wherein the lamp is provided with a hand-operated manual switch and in that the tilt switches are connected in series with the manual switch and with the light source and the energy source.

15. The lamp as claimed in claim 3, wherein the lamp is provided with a dimmer which is connected between the energy source and the light source and in that the tilt switches are designed to control the dimmer.

16. The lamp as claimed in claim 3, wherein the light source is designed to generate laser light.

17. The lamp as claimed in claim 3, wherein the lamp comprises a separable part wherein the tilt switches are accommodated.

18. The lamp as claimed in claim 3, wherein at least one of the tilt switches is a mechanical or electronic switch designed to control, as a function of the angle, a suitable effect depending on the used light source.

19. The lamp as claimed in claim 18, wherein a time-dependent effect is realized which occurs after a certain period at a certain angle.

20. The lamp as claimed in claim 3, wherein the lamp is mounted in or on a fixedly arranged structure.

* * * * *

UNITED STATES PATENT AND TRADEMARK OFFICE
CERTIFICATE OF CORRECTION

PATENT NO.           : 9,458,997 B2                                    Page 1 of 1
APPLICATION NO.      : 14/409945
DATED                : October 4, 2016
INVENTOR(S)          : Steiner Finn Boye Henskes It is certified that error appears in the above-identified patent and that said Letters Patent is hereby corrected as shown below:

In the CLAIMS:

Claim 13, col 6 line 40 reads "13. The lamp as claimed in claim 11, wherein the lamp is"

Claim 13, col 6 line 40 should read --13. The lamp as claimed in claim 1, wherein the lamp is--

Signed and Sealed this
Twentieth Day of December, 2016

Michelle K. Lee
*Director of the United States Patent and Trademark Office*